(12) United States Patent
Hu et al.

(10) Patent No.: US 12,362,240 B2
(45) Date of Patent: Jul. 15, 2025

(54) METHOD AND SYSTEM FOR DETECTING SEMICONDUCTOR DEVICE

(71) Applicant: TAIWAN SEMICONDUCTOR MANUFACTURING COMPANY LTD., Hsinchu (TW)

(72) Inventors: Fan Hu, Taipei (TW); Wen-Chuan Tai, Hsinchu (TW); Hsiang-Fu Chen, Hsinchu County (TW); I-Chieh Huang, Tainan (TW); Tzu-Chieh Wei, Taichung (TW); Kang-Yi Lien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 540 days.

(21) Appl. No.: 17/815,902

(22) Filed: Jul. 28, 2022

(65) Prior Publication Data
US 2024/0038597 A1    Feb. 1, 2024

(51) Int. Cl.
*H01L 21/66* (2006.01)
(52) U.S. Cl.
CPC ............. *H01L 22/12* (2013.01); *H01L 22/20* (2013.01); *H01L 22/24* (2013.01)

(58) Field of Classification Search
CPC .......... H01L 22/12; H01L 22/20; H01L 22/24
See application file for complete search history.

(56) References Cited

U.S. PATENT DOCUMENTS

| | | | | |
|---|---|---|---|---|
| 8,027,527 B2* | 9/2011 | Shibuya | ............... | G01N 21/956 382/141 |
| 8,817,251 B2* | 8/2014 | Tsuchiya | ............ | G01N 21/9501 356/237.5 |
| 8,853,628 B2* | 10/2014 | Hosoya | ................... | H01J 37/28 250/311 |
| 2004/0254752 A1* | 12/2004 | Wisniewski | ............ | H01L 22/20 257/E21.525 |
| 2016/0199287 A1* | 7/2016 | Banowski | ............... | A61K 8/466 424/68 |
| 2022/0196723 A1* | 6/2022 | Price | ................... | G01R 31/2601 |

* cited by examiner

*Primary Examiner* — Michael M Trinh
(74) *Attorney, Agent, or Firm* — WPAT LAW; Anthony King

(57) ABSTRACT

A method and a system for detecting a semiconductor device are provided. The method comprises obtaining an image of the semiconductor device, evaluating a feature of the image, detecting a defect of the semiconductor device based on the feature, extracting a defect information for the defect, calculating a defect die ratio (DDR) in response to the defect and analyzing a relation between the DDR and the defect information.

20 Claims, 16 Drawing Sheets

METHOD AND SYSTEM FOR DETECTING SEMICONDUCTOR DEVICE

BACKGROUND

The present disclosure relates, in general, to methods and systems for detecting a semiconductor device. Specifically, the present disclosure relates to inspecting defects in a semiconductor device.

Defect inspection is an important part of semiconductor device manufacture, with image processing widely used therein. However, the process can be time consuming and costly. Therefore, more efficient methods and systems for defect inspection of a semiconductor device are called for.

BRIEF DESCRIPTION OF THE DRAWINGS

Aspects of the embodiments of the present disclosure are best understood from the following detailed description when read with the accompanying figures. It should be noted that, in accordance with standard practice in the industry, various structures are not drawn to scale. In fact, the dimensions of the various structures can be arbitrarily increased or reduced for clarity of discussion.

DETAILED DESCRIPTION

Figure 1:
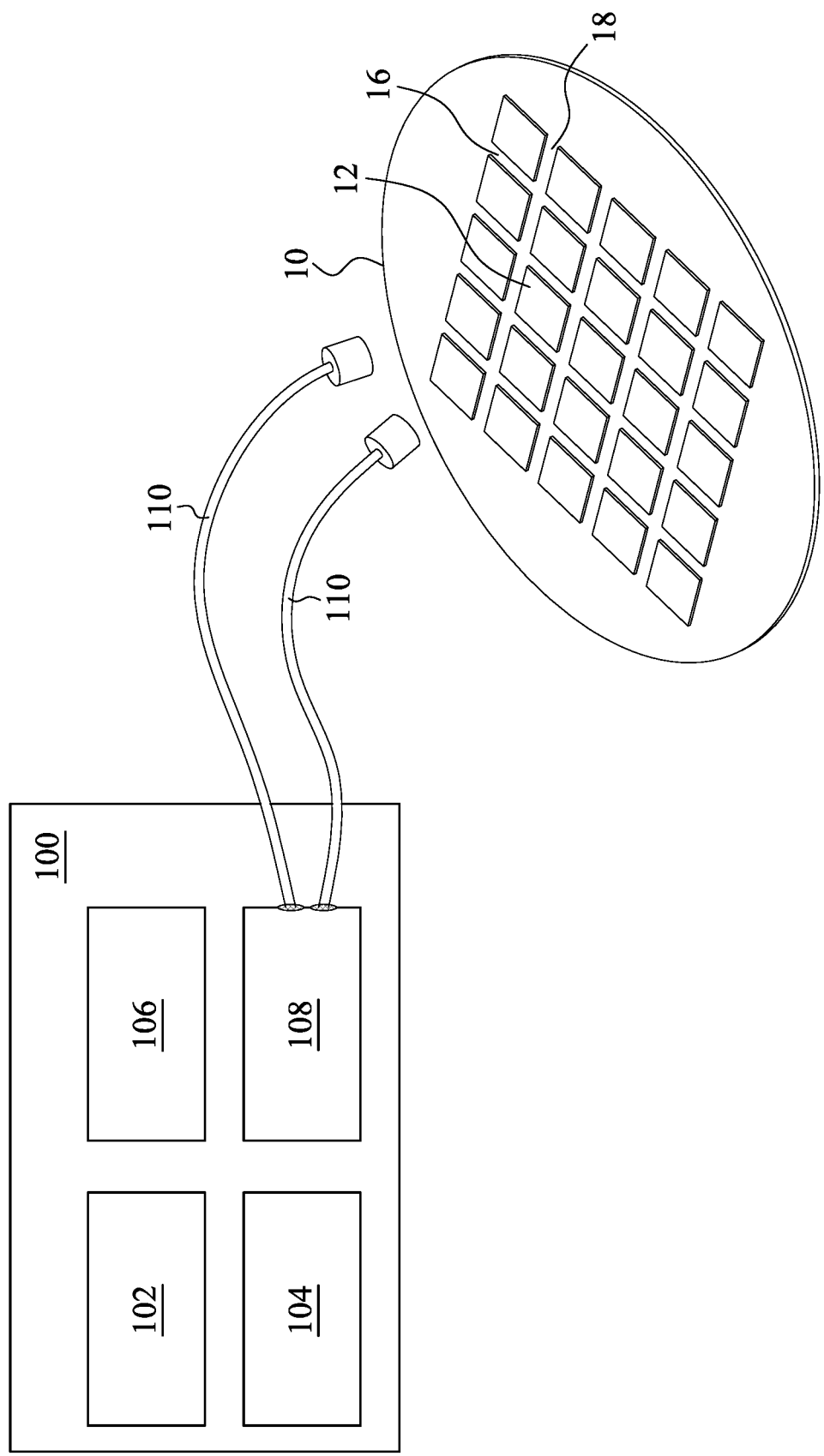
FIG. 1 is a schematic view of a system for measuring a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic view of a system 100 for detecting a semiconductor device, in accordance with some embodiments of the present disclosure. FIG. 1 shows a system 100 for testing or measuring a semiconductor wafer 10. FIG. 1 also shows a semiconductor wafer 10 on which a semiconductor die to be tested or measured can be included.

The semiconductor wafer 10 can include an elementary semiconductor such as silicon, germanium, or diamond. The semiconductor wafer 10 may include one or more dies 12 formed thereon. A plurality of scribe lines 16 and 18 can be provided between adjacent dies 12 so that dies 12 can be separated or singulated in subsequent processing. In some embodiments, the dies 12 can be integrated circuits (ICs) or chips. The semiconductor wafer 10 may include a plurality of dies 12 and several process control monitoring (PCM) devices (not shown in FIG. 1A). A PCM device can be regarded as a benchmark device that can be utilized to evaluate the characteristics or performance of the dies 12.

Referring to FIG. 1, the system 100 can constitute testing or measurement equipment. The system 100 may include hardware and software components that provide a suitable operational or functional environment in which the dies 12 can be tested. In some embodiments, the system 100 may include a processor 102, a signal generator 104, a monitor 106, a coupler 108, and optical sensors 110.

Signals and commands can be transmitted between each of the processor 102, the signal generator 104, the monitor 106, and the coupler 108. In some embodiments, the signals transmitted within the system 100 can include power signals having adjustable voltage levels. In some embodiments, the signals transmitted within the system 100 can include optical signals having various frequencies. The system 100 can include a C-mode scanning acoustic microscope (C-SAM).

In various embodiments, the processor 102 may include, but is not limited to, at least one hardware processor, including at least one microprocessor such as a CPU, a portion of at least one hardware processor, or any other suitable dedicated processor such as those developed based on Field Programmable Gate Array (FPGA) and Application Specific Integrated Circuit (ASIC).

The signal generator 104 may be configured to provide or receive test signals. All types of optical signals and electrical signals, such as acoustic signals, microwave signals, data signals, clock signals, or power signals, can be provided to a PCM device associated with the die 12. In some embodiments, optical signals constituting an image of the semiconductor wafer 10 can be provided to the signal generator 104.

The monitor 106 may be configured to determine whether the semiconductor wafer 10 complies with testing criteria. The signals fed back from the semiconductor wafer 10 can be evaluated by the monitor 106, and a determination can be made whether the semiconductor wafer 10 complies with the testing criteria. The monitor 106 can provide information and/or instructions to the user. The monitor 106 can display information and/or instructions to the user. In some embodiments, the monitor 106 can display pop-up notifications. The monitor 106 can provide alarm messages to the user when the semiconductor wafer fails to comply with certain test criteria. In some embodiments, the coupler 108 may be configured to couple the processor 102 and the monitor 106 to the optical sensor 110 for measuring the semiconductor wafer 10.

The optical sensor 110 can detect or receive optical signals on the semiconductor wafer 10 in order to measure characteristics and performance of the semiconductor wafer 10. In some embodiments, the optical sensor 110 may include APS, CMOS image sensor, CCD, infra-red sensor, optical-sensing transistor, or various optical cameras.

Figure 2A:
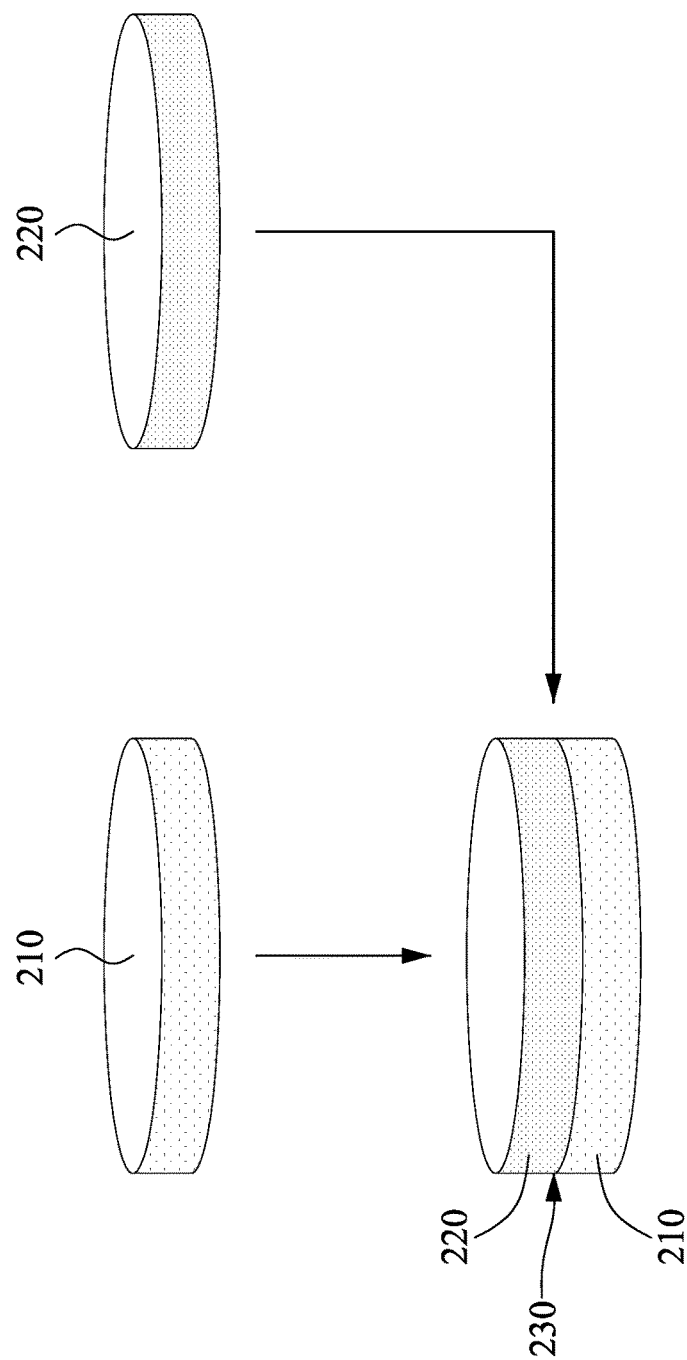
FIG. 2A is a schematic view of bonding two semiconductor wafers, in accordance with some embodiments of the present disclosure.

FIG. 2A is a schematic view of bonding two semiconductor wafers 210 and 220, in accordance with some embodiments of the present disclosure. The semiconductor device 20 can include two semiconductor wafers 210 and 220. The semiconductor device 20 may include stacked semiconductor wafers. Bonding techniques, which may refer to bonding that involves two or more materials, can be used to form a semiconductor device 20.

In some embodiments, hybrid bonding technique can be used to form a semiconductor device 20. The semiconductor device 20 can be formed by heat and compression. Hybrid bonding can refer to bonding that involves two or more materials (e.g. metal-to-metal bonding and dielectric-to-dielectric bonding). The semiconductor wafer 210 can be bonded to the semiconductor wafer 220.

In some embodiments, the semiconductor wafer 220 can be bonded to the semiconductor wafer 210 by fusion. The semiconductor wafer 220 can be bonded to the semiconductor wafer 210 by an adhesive layer therebetween. The semiconductor wafer 220 can be located on the semiconductor wafer 210. An interface 230 can exist between the semiconductor wafers 220 and 210. The semiconductor wafer 220 may be in direct contact with the semiconductor wafer 210. The interface 230 can include or contact a lower surface of the semiconductor wafer 220. The interface 230 can include or contact an upper surface of the semiconductor wafer 210.

Figure 2B:
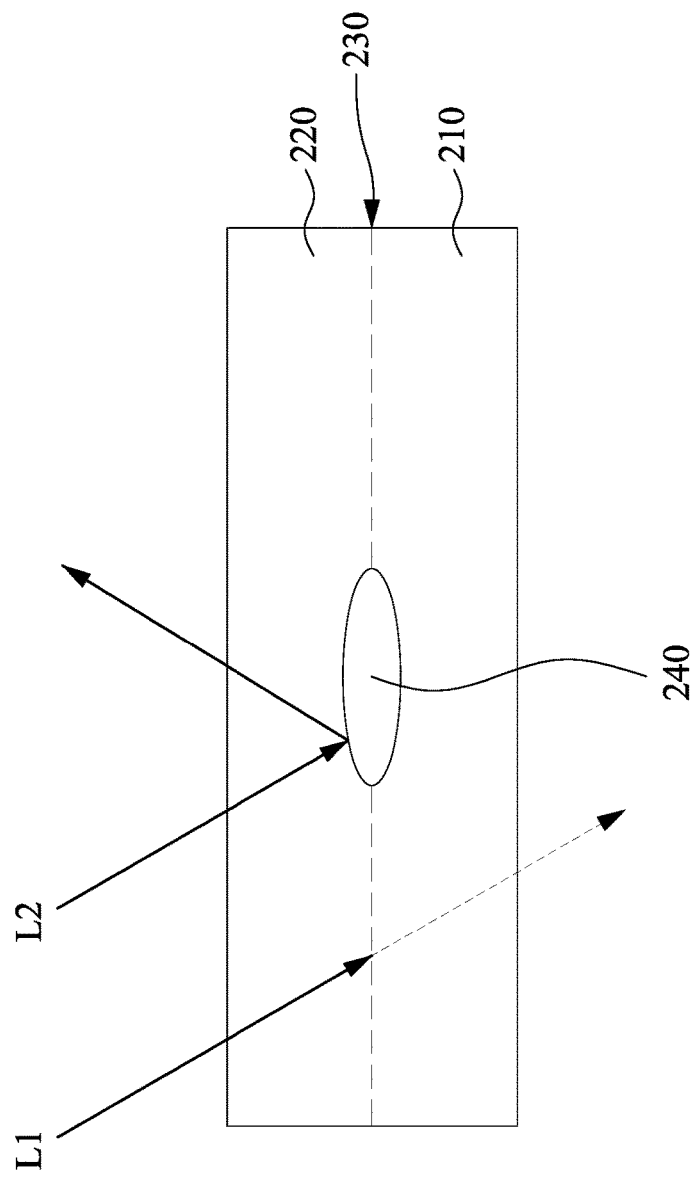
FIG. 2B is a schematic view of a defect in a semiconductor device, in accordance with some embodiments of the present disclosure.

FIG. 2B is a schematic view of a defect 240 of a semiconductor device 30, in accordance with some embodiments of the present disclosure. In some embodiments, a defect 240 may exist on the interface 230 between the semiconductor wafers 210 and 220. The defect 240 may occur during the process of bonding the semiconductor wafers 210 and 220. The defect 240 may occur after the process of bonding the semiconductor wafers 210 and 220. The defect 240 may occur due to a particle being introduced during the process of bonding the semiconductor wafers 210 and 220. The defect 240 may occur due to peeling off related to the semiconductor wafers 210 and 220.

In some embodiments, the defect 240 can be a trap void on the interface 230. The trap void can include an air gap between the semiconductor wafers 210 and 220. A portion of the semiconductor wafer 210 may not directly contact the semiconductor wafer 220 due to the trap void. The defect 240 could result in failure of the semiconductor device 20.

In some embodiments, a plurality of optical signals can be emitted from the system 100 for detecting the defects of semiconductor device 20. As shown in FIG. 2B, the optical signal L1 can transmit or penetrate the semiconductor wafer 220, the interface 230 and the semiconductor wafer 210. The optical signal L2 may be transmitted into the semiconductor wafer 220 and reflected by the defect 240 without being transmitted to the semiconductor wafer 210. The defect 240 can be detected or measured by evaluating the features of the optical signals L1 and L2. The defect 240 can be detected or measured by evaluating the features of the optical signal L2.

Figure 3:
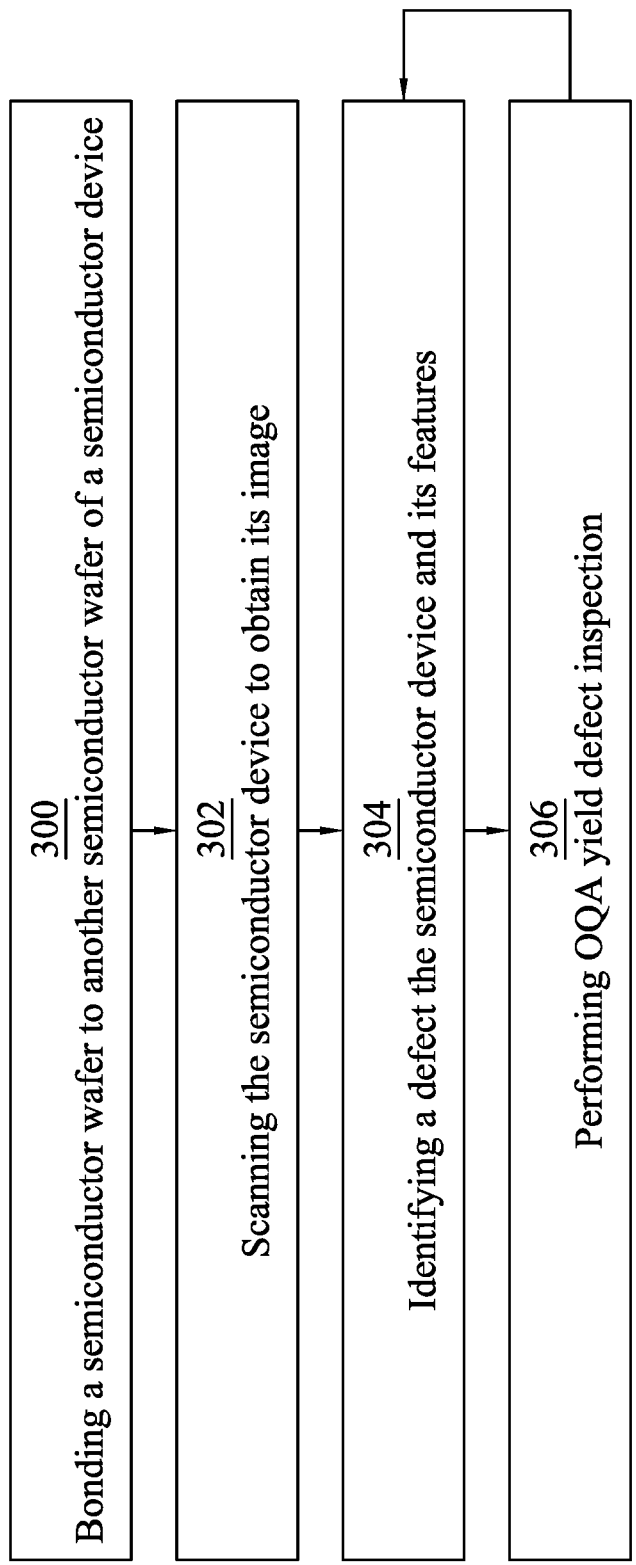
FIG. 3 is a flowchart showing operations for detecting a defect in a semiconductor device, in accordance with some embodiments of the present disclosure.

FIG. 3 is a flowchart showing operations for detecting a defect in a semiconductor device, in accordance with some embodiments of the present disclosure. In operation 300, a semiconductor wafer is bonded to another semiconductor wafer of a semiconductor device. In operation 302, the semiconductor device is scanned to obtain an image. In operation 304, the defect of the semiconductor device and its features are identified. In operation 306, outgoing quality assurance (OQA) yield defect inspection is performed. More details for the operations 300, 302, 304, and 306 are provided in the embodiments of FIG. 4A to FIG. 4C.

Note that the disclosed ordering of such acts or events is not intended to be interpreted in a limiting sense. For example, some operations may occur in different order and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4A:
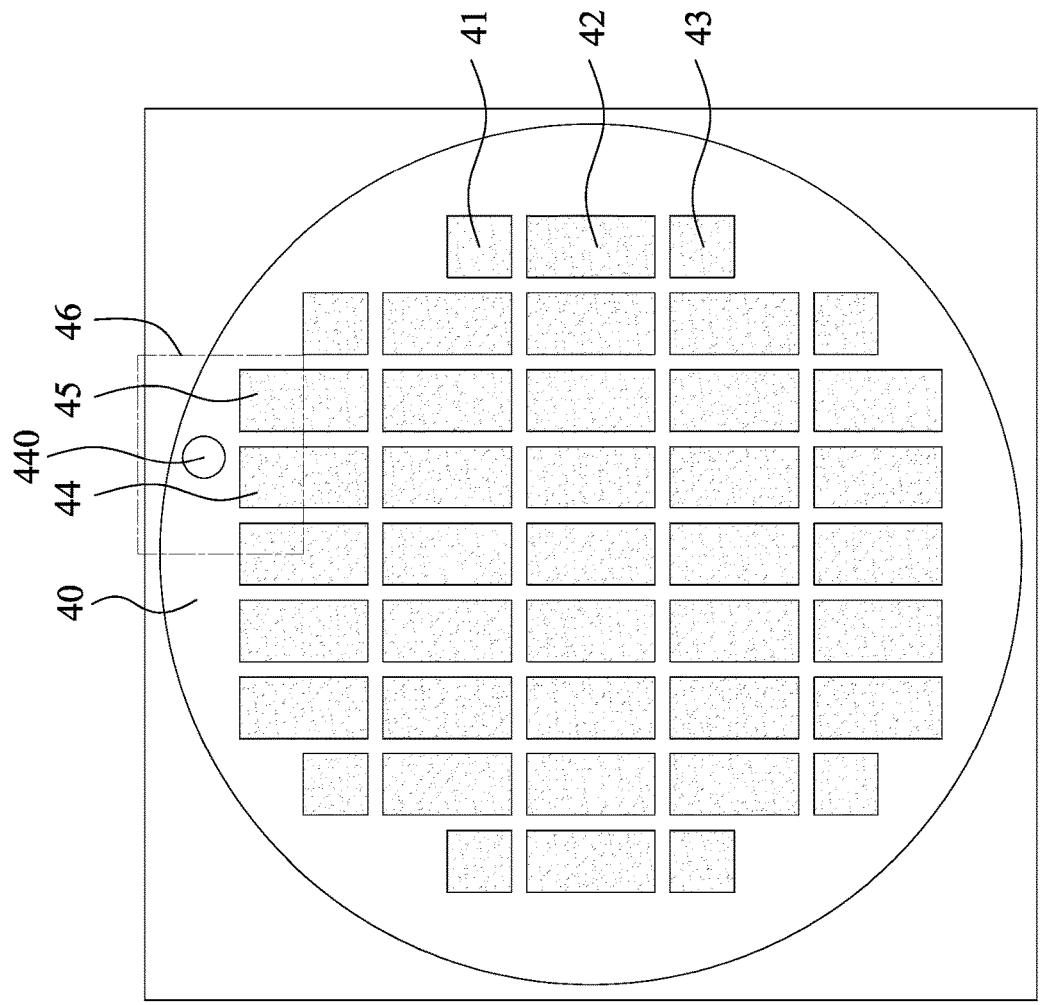
FIG. 4A is a schematic view of a defect in a semiconductor device, in accordance with some embodiments of the present disclosure.

FIG. 4A is a schematic view of an image of a defect 440 of a semiconductor device 400, in accordance with some embodiments of the present disclosure. The embodiment of FIG. 4A may correspond to the operation 302 of FIG. 3. The image of FIG. 4A is a top view of the semiconductor wafer 40. The image can be obtained by scanning the semiconductor device 400. The semiconductor wafer 40 includes a plurality of dies, such as dies 41, 42, 43, 44, and 45. In addition, a defect 440 exists within the portion 46 near the edge of the semiconductor wafer 40.

Figure 4B:
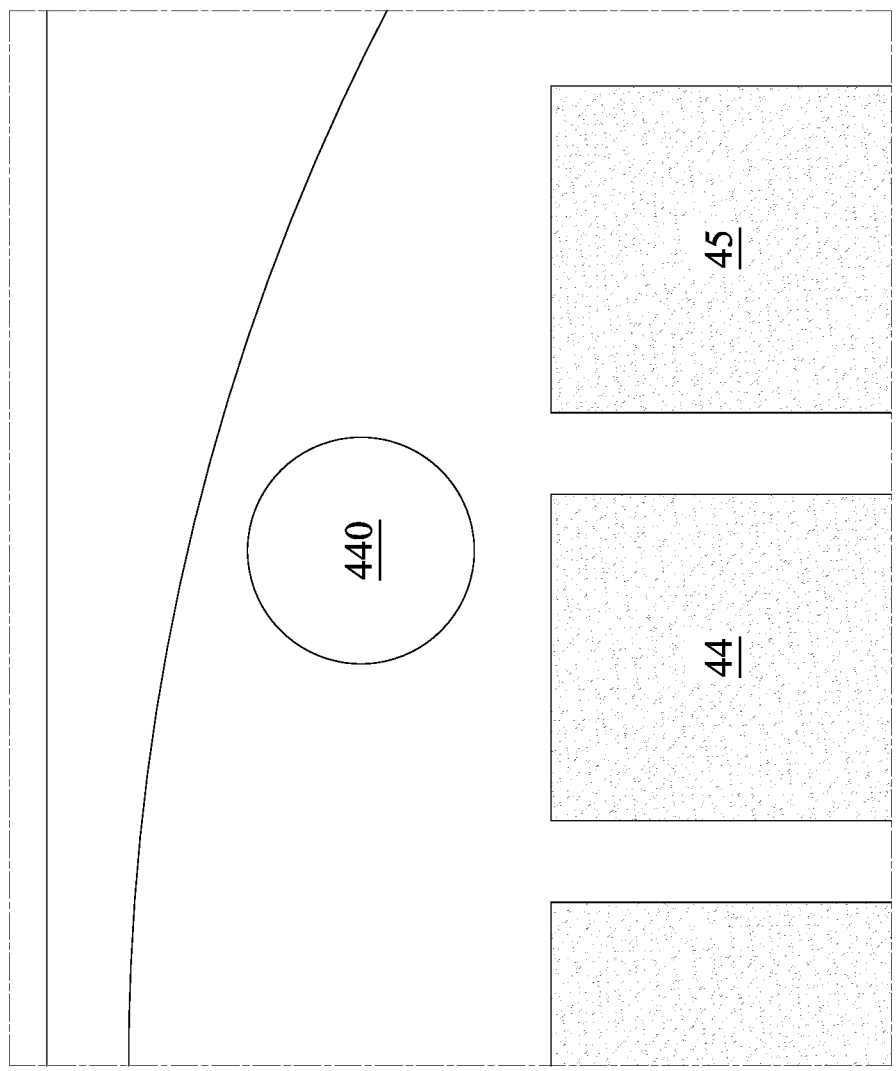
FIG. 4B is another schematic view of a defect in a semiconductor device, in accordance with some embodiments of the present disclosure.

FIG. 4B is another schematic view of the portion 46 including the defect 440 in the semiconductor device 400, in accordance with some embodiments of the present disclosure. The embodiment of FIG. 4B may correspond to the operation 304 of FIG. 3. In some embodiments, the defect 440 of the semiconductor device 400 and its defect information are identified. The defect information can include but is not limited to at least one of a defect position, a defect perimeter, a defect area, a defect size and a total number of the defects.

In some embodiments, the defect information can be used to calculate a defect die ratio (DDR) for evaluating the impact or damage caused by the defect on the semiconductor device. For example, as shown in FIG. 4B, the defect 440 is located between the edge of the semiconductor wafer 40 and the dies 44 and 45. Accordingly, the dies 44 and 45 may be affected and damaged since they are near or close to the defect 440.

The defect information can be extracted or evaluated by executing machine-readable instructions, including source code or various appropriate programming languages. Some examples of programming languages that may be used to store the instruction set comprise, but are not limited to: Java, C, C++, Python, Objective-C, Visual Basic, or .NET programming. In some embodiments a compiler or interpreter is comprised to convert the instruction set into machine executable code for execution by the processor.

Figure 4C:
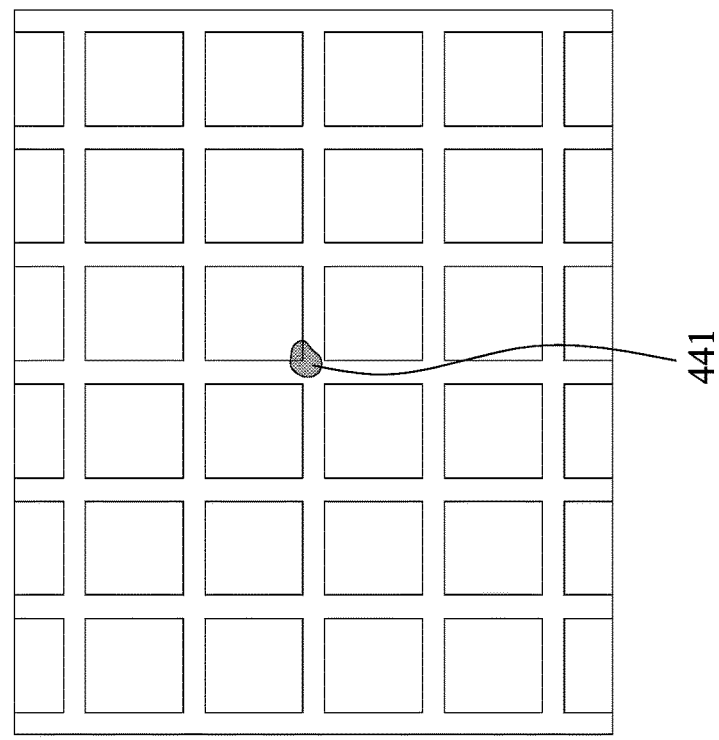
FIG. 4C is another schematic view of a defect in a semiconductor device, in accordance with some embodiments of the present disclosure.

FIG. 4C is another schematic view of a defect 441 of a semiconductor device 400, in accordance with some embodiments of the present disclosure. The embodiment of FIG. 4C may correspond to the operation 306 of FIG. 3. In some embodiments, the OQA yield defect inspection can be executed to determine the quality of the semiconductor device in the final stage of OQA. As shown in FIG. 4C, a defect 441 is detected, and thus the semiconductor device 400 may be scrapped or discarded.

In some embodiments, a criteria such as determining a threshold defect size can be applied to evaluate whether to ship or scrap the semiconductor device 400 before the final stage of OQA. More specifically, when the defect size exceeds a threshold, the semiconductor device will be scrapped or discarded. When the defect size is smaller than or equal to the threshold, the semiconductor device will be shipped. As a result, the defect can identified prior to the OQA stage, such that costs of the outlier wafer being released to the OQA stage can be reduced.

Figure 5A:
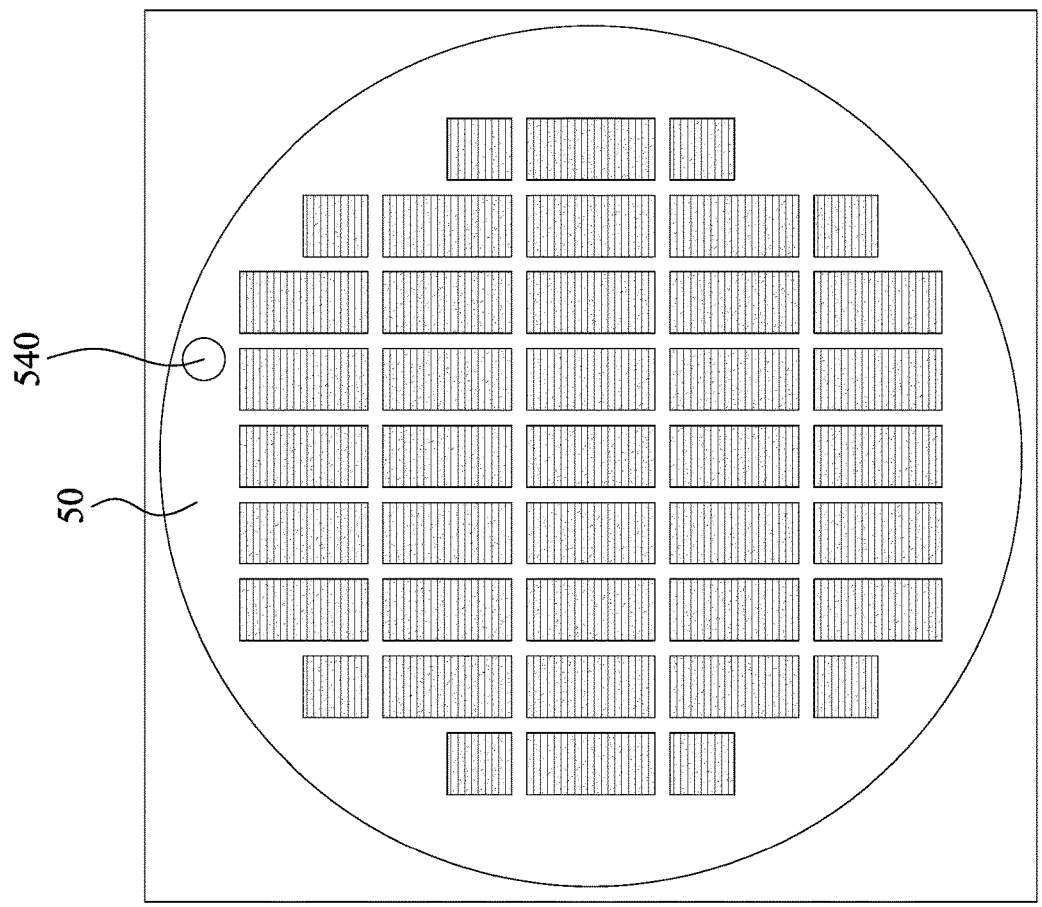
FIG. 5A is a schematic view of a defect in a semiconductor device, in accordance with some embodiments of the present disclosure.

FIG. 5A is a schematic view of an image of a defect 540 in a semiconductor device 500A, in accordance with some embodiments of the present disclosure. The image of FIG. 5A is similar to that of FIG. 4A except that further adjustments can be performed on the image for detecting and evaluating the defects.

In some embodiments, wafer edge for length reference, such as the stripes in FIG. 5A, can be defined so that the image can be analyzed in detail with reference to pixels. Each die and defect can be precisely positioned by pixel values. Therefore, defect information including brightness, position, perimeters, area, and size can be calculated or obtained accordingly.

Figure 5B:
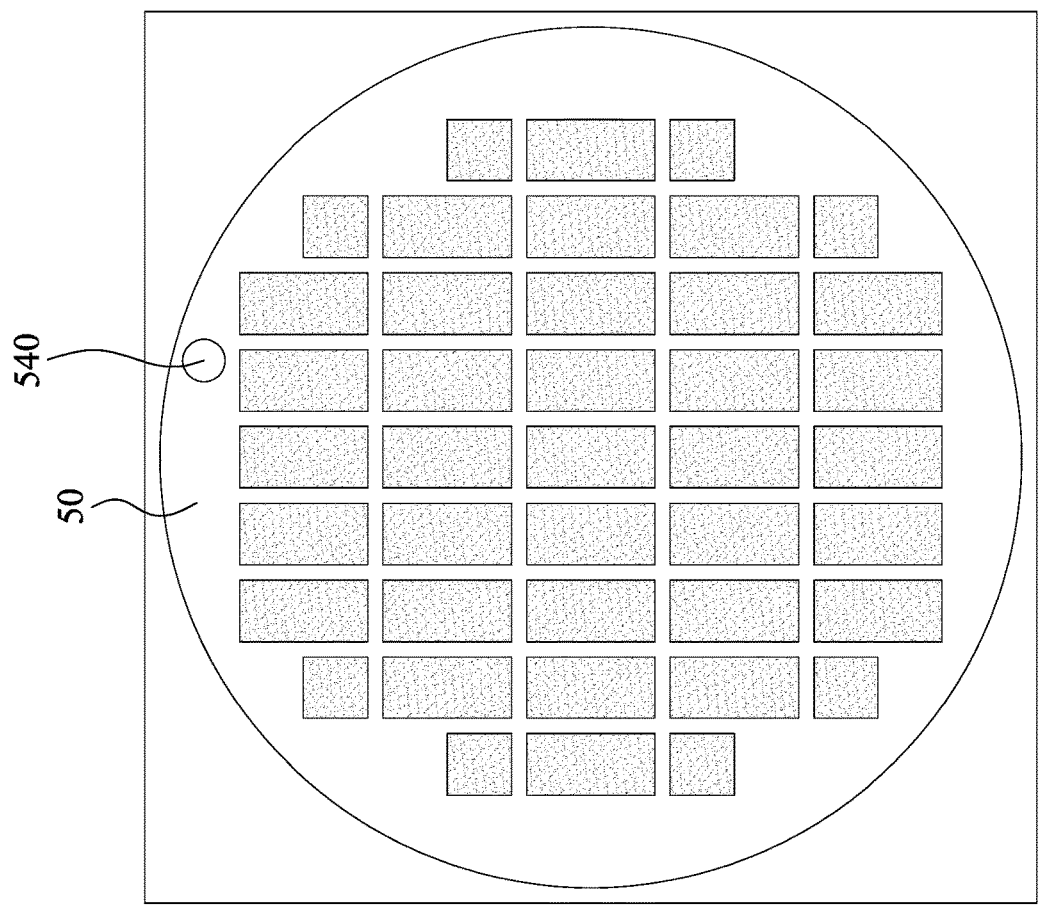
FIG. 5B is another schematic view of a defect in a semiconductor device, in accordance with some embodiments of the present disclosure.

FIG. 5B is another schematic view of an image of a defect 540 of a semiconductor device 500B, in accordance with some embodiments of the present disclosure. The image of FIG. 5B is similar to that of FIG. 5A except that further adjustments can be performed on the image for detecting and evaluating the defects. In some embodiments, smoothing and blurring can be performed on the image in order to remove the outlier pixel. The image in FIG. 5A can be more uniform, and image contrast increased. As a result, the defect can be monitored and detected accurately.

Figure 5C:
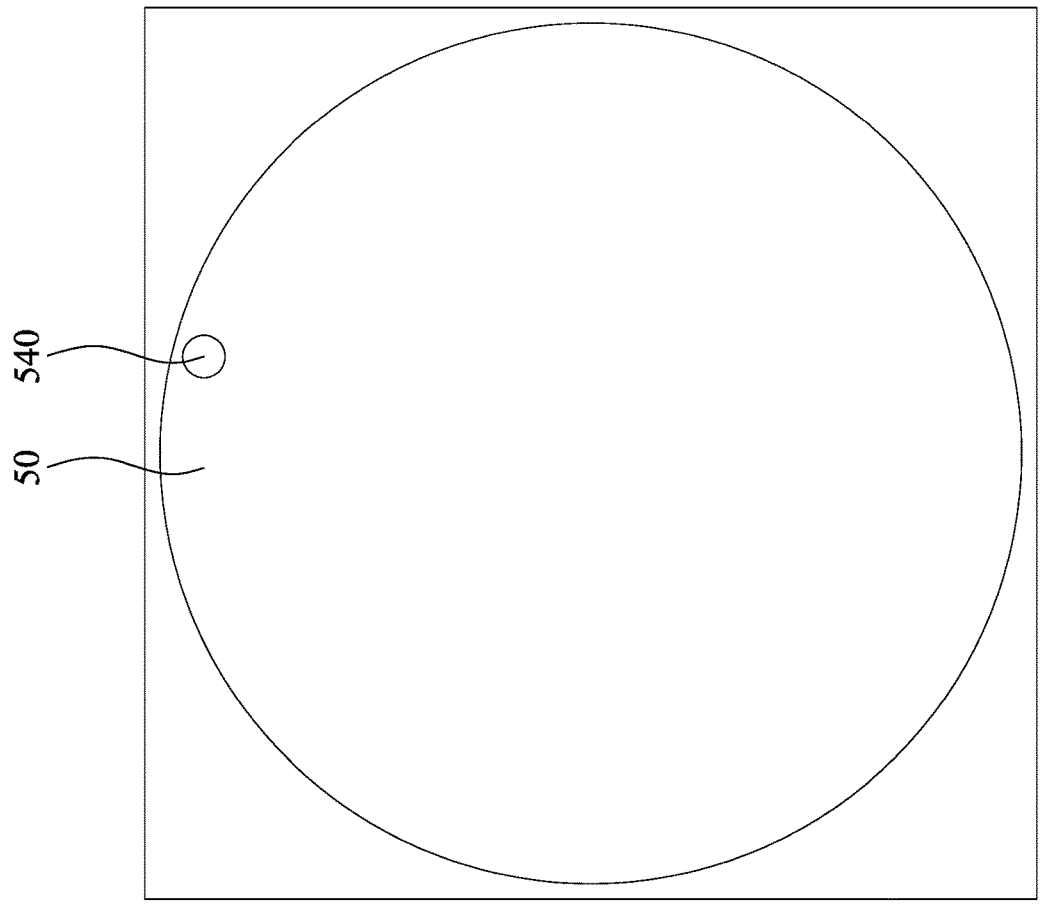
FIG. 5C is another schematic view of a defect in a semiconductor device, in accordance with some embodiments of the present disclosure.

FIG. 5C is another schematic view of an image of a defect 540 in a semiconductor device 500C, in accordance with some embodiments of the present disclosure. The embodiment of FIG. 5C can be executed after that of FIG. 5B. In some embodiments, the brightness of the defect can exceed that of other portions of the image. Therefore, the brightness can be used to identify the defect 540.

The brightness of the image of the semiconductor wafer 50 can be in a range of 0 (which indicates black) to 255 (which indicates white). A threshold brightness value can be determined to assess or judge the defect. The threshold brightness value may be determined by a user. For example, the threshold brightness value may be determined as 190. When the brightness is greater than the threshold brightness value, it can be identified as a defect.

Figure 5D:
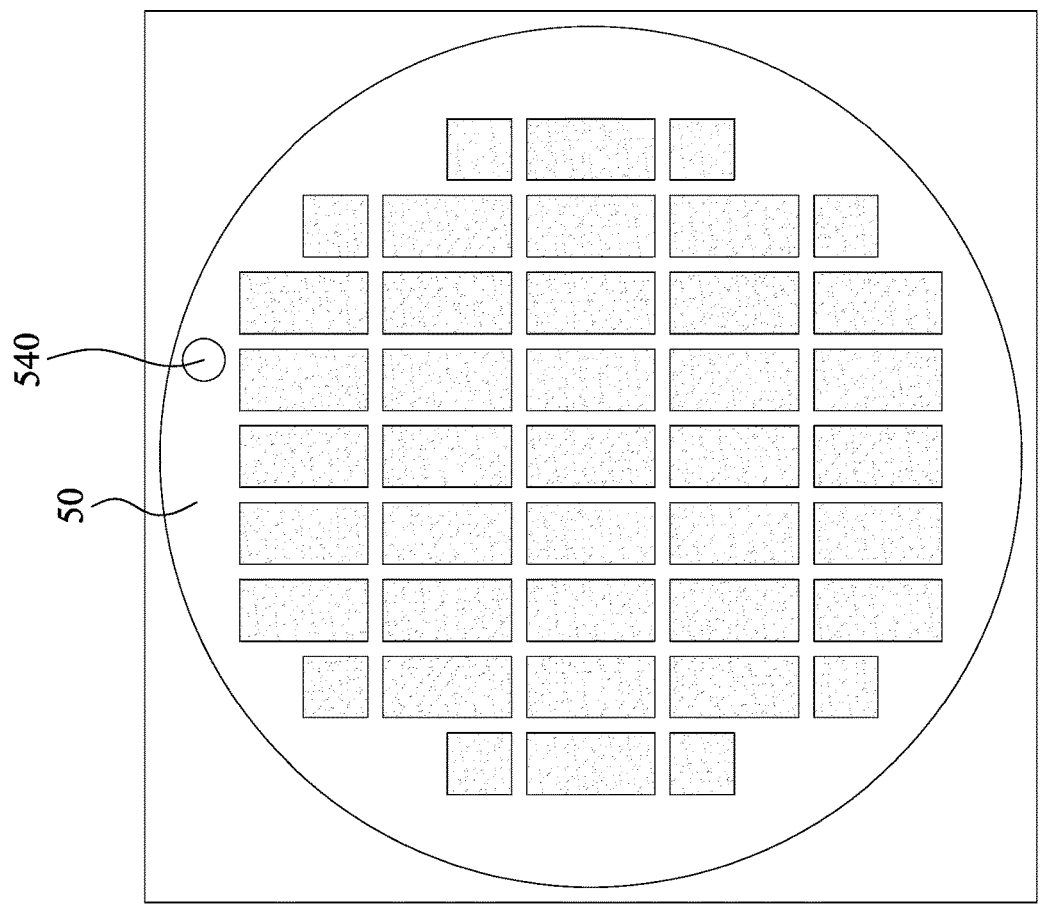
FIG. 5D is another schematic view of a defect in a semiconductor device, in accordance with some embodiments of the present disclosure.

FIG. 5D is another schematic view of an image of a defect 540 of a semiconductor device 500D, in accordance with some embodiments of the present disclosure. The embodiment of FIG. 5D can be executed after that of FIG. 5C. In some embodiments, the defect 540 can be further contoured in order to extract multiple defect information.

In some embodiments, each defect can be assigned an identification number in association with multiple defect information, such as a defect position, a defect perimeter, a defect area, and a defect size. The defect position can include pixel values corresponding to the location or position where the defect appears. The defect perimeter can indicate the size of the defect. The defect perimeter is generally proportional to the size of the defect. The defect area can indicate the region occupied by the defect. The defect area is generally proportional to the size of the defect.

In some embodiments, a ratio can be obtained by dividing the defect area with the defect perimeter. The obtained ration can be used to depict the shape of the defect. Accordingly, the defect type can be determined according to the obtained ratio related to the defect shape and the defect size. The proposed method of the present disclosure can be applied to identify or recognize the defect type. In some embodiments, the relation between the DDR and the defect information can be analyzed when the defect type is the trap void. Therefore, the defect can be inspected more precisely and efficiently.

More specifically, the defect type can be identified as a trap void when the ratio is in a range of 0.8 to 2. The defect type can be identified as a trap void when the ratio is smaller than 2. The defect type can be identified as a trap void when the ratio is approximately equal to one. In some embodiments, the defect type can be identified as an edge overpolish when the ratio is in a range of 2 to 4. The defect type can be identified as an edge overpolish when the ratio is greater than 2.

Figure 6A:
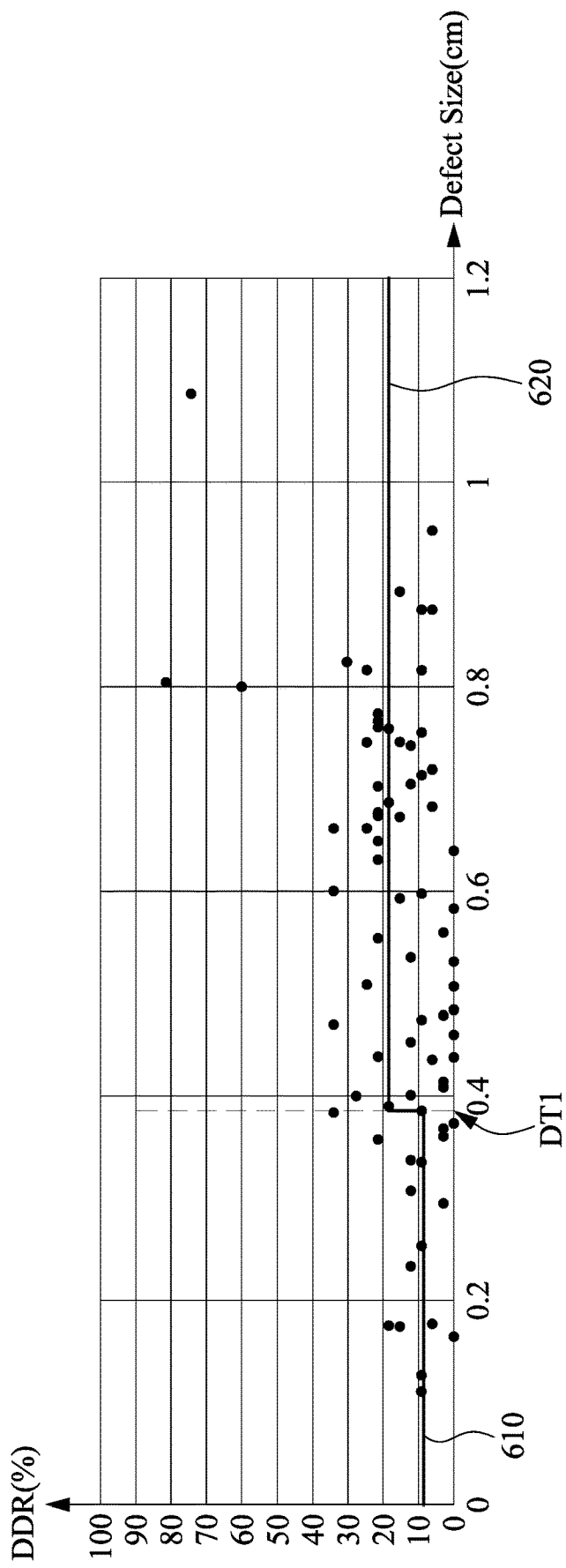
FIG. 6A is a schematic chart illustrating the defect die ratio and the defect size, in accordance with some embodiments of the present disclosure.

FIG. 6A is a schematic chart illustrating the DDR and the defect size, in accordance with some embodiments of the present disclosure. Each dot of FIG. 6A represents the DDR versus the defect size. In some embodiments, the DDR is substantially proportional to the defect size. In other words, DDR increases with defect size.

In some embodiments, a threshold defect size DT1 can be determined to further analyze the trend of DDR. The threshold defect size DT1 can be determined to maximize a difference between an average DDR 610 below the threshold defect size DT1 and another average DDR 620 above the threshold defect size DT1. As shown in FIG. 6A, the threshold defect size DT1 is about 0.38 cm, the average DDR 610 is about 8.2%, and the average DDR 620 is about 17.9%. The difference between the average DDR 610 and the average DDT 620 is up to about 9.7%.

Upon calculation, if the threshold defect size DT1 is greater than or smaller than 0.38 cm, the difference between the average DDR 610 and the average DDR 620 will be decreased from the maximum value of 9.7%. Therefore, the difference or gap can be determined so that the average DDR 620 is higher than the average DDR 610 as much as possible. Afterwards, the defect can be scrapped when the defect size is greater the threshold defect size since it causes high DDR, and thus the quality of the semiconductor wafer can be improved.

Figure 6B:
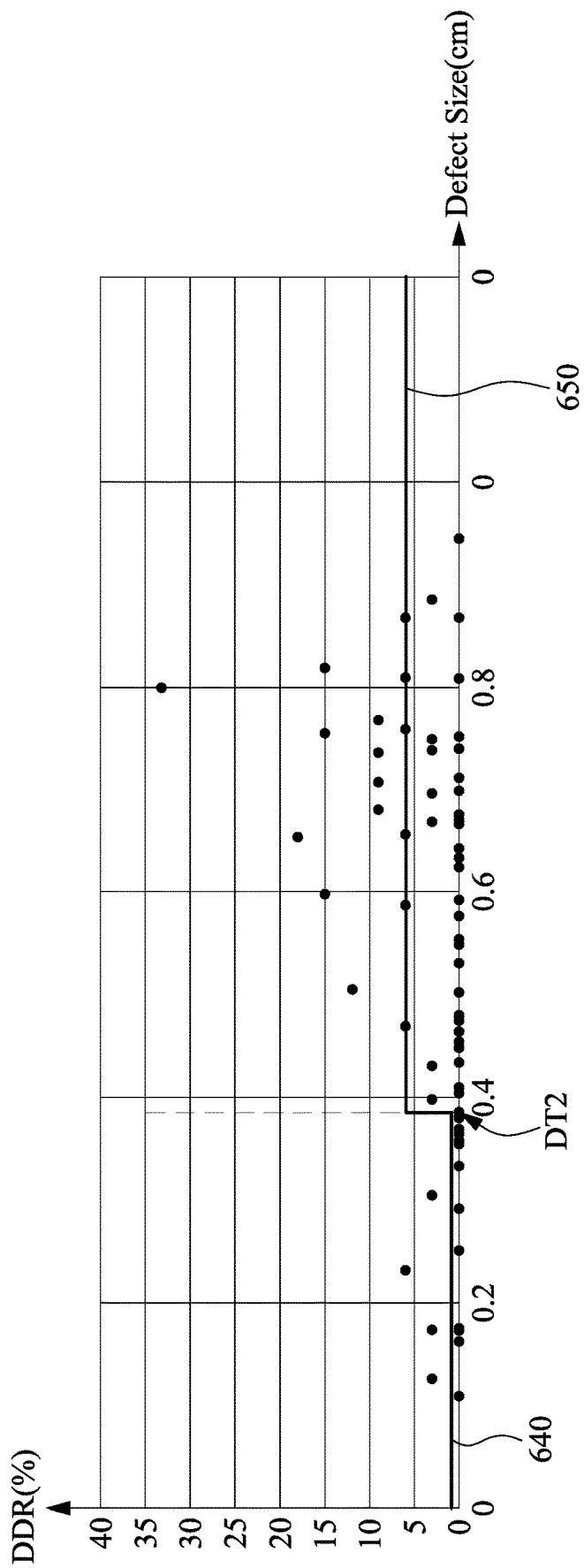
FIG. 6B is another schematic chart illustrating the defect die ratio and the defect size, in accordance with some embodiments of the present disclosure.

FIG. 6B is another schematic chart illustrating the DDR and the defect size, in accordance with some embodiments of the present disclosure. The embodiments of FIG. 6A can include three contributing factors which are related to defects and results in the DDR. The contributing factors can include the particle, the peeling and other kinds of defects caused during the bonding process. The embodiments of FIG. 6B mainly include one contributing factor including the peeling.

As illustrated in FIG. 6B, the threshold defect size DT2 is about 0.38 cm, the average DDR 640 is about 0.8%, and the average DDR 650 is about 6.1%. The difference between the average DDR 640 and the average DDT 650 is up to about 5.3%. Although the difference between the average DDR 640 and the average DDR 650 in FIG. 6B is less than the difference between the average DDR 620 and the average DDR 610 in FIG. 6A, the peeling factor can be the dominant factor among all contributing factors due its higher contribution than other factors. As a result, the main cause of the defect can be analyzed and investigated by the proposed method of the present disclosure.

Figure 7:
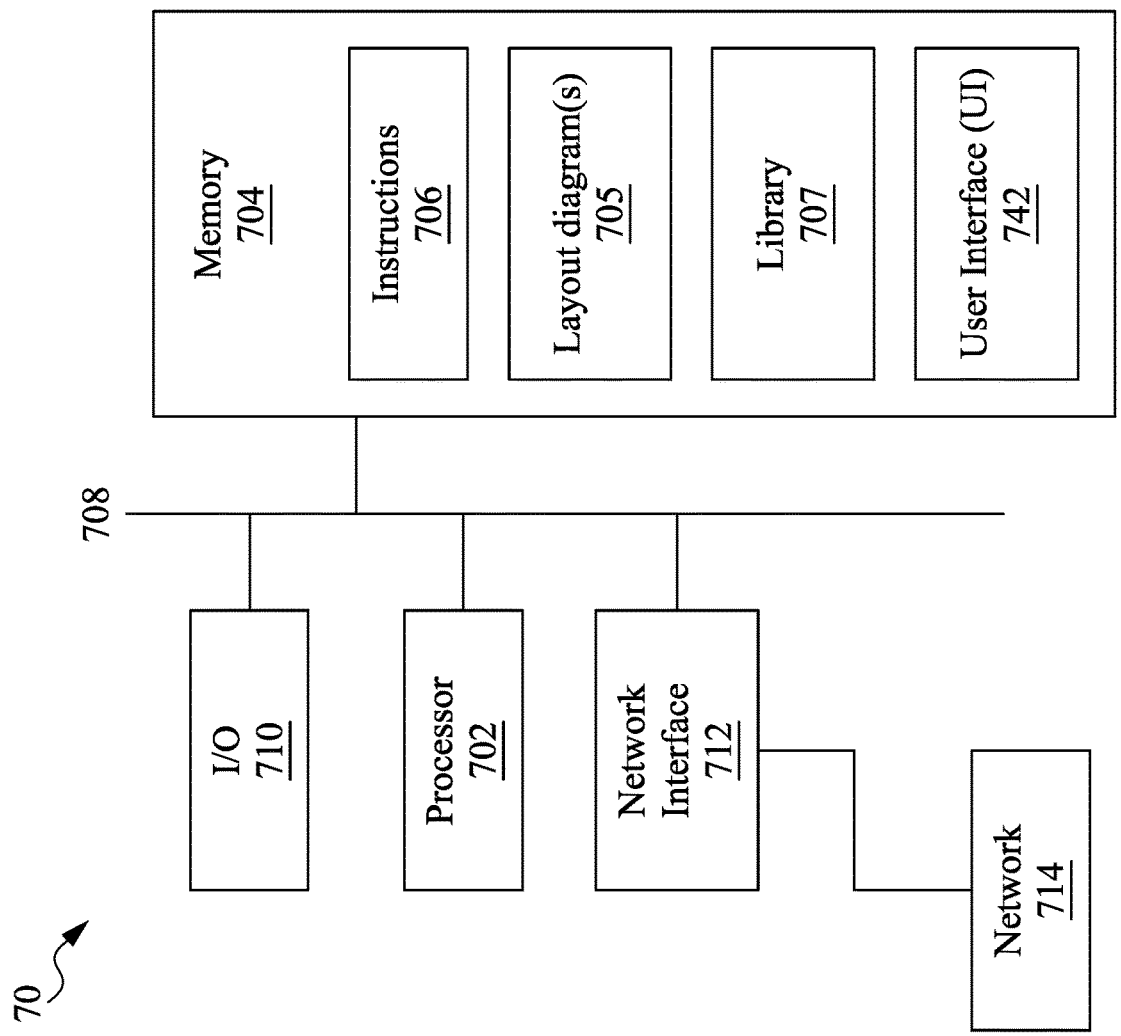
FIG. 7 is a block diagram of a system of detecting a semiconductor device, in accordance with some embodiments.

FIG. 7 is a block diagram of a system 70 of detecting a semiconductor device, in accordance with some embodiments. FIG. 7 is a block diagram of a system 70 of detecting a semiconductor device, in accordance with some embodiments. The system 70 can include, for example, an electronic design automation (EDA) system.

In some embodiments, the system 70 includes an automatic placement and routing (APR) system. Methods described herein of detecting defects in a semiconductor device, in accordance with one or more embodiments, are implementable, for example, using the system 70, in accordance with some embodiments.

In some embodiments, the system 70 is a general purpose computing device including a hardware processor 702 and a memory 704. The memory 704 may be a computer-readable storage medium 704. The storage medium 704, amongst other things, is encoded with, computer program code 706 or a set of executable instructions. Execution of instructions 706 by hardware processor 702 represents (at least in part) an EDA tool which implements a portion or all of a method according to an embodiment, e.g., the methods described herein in accordance with one or more embodiments (hereinafter, the noted processes and/or methods).

The processor 702 may be electrically coupled to the memory 704 (such as computer-readable storage medium) via the bus 708. The processor 702 may be electrically coupled to an I/O interface 710 by bus 708. A network interface 712 may be electrically connected to processor 702 via bus 708. Network interface 712 may be connected to a network 714, so that processor 702 and the memory 704 are capable of connecting to external elements via network 714. Processor 702 may be configured to execute computer program code 706 encoded in memory 704 in order to cause system 70 to be usable for performing a portion or all of the noted processes and/or methods. In one or more embodiments, the processor 702 is a central processing unit (CPU), a multi-processor, a distributed processing system, an application specific integrated circuit (ASIC), and/or a suitable processing unit.

In one or more embodiments, the memory 704 may be an electronic, magnetic, optical, electromagnetic, infrared, and/or semiconductor system (or apparatus or device). For example, the memory 704 may include a semiconductor or solid-state memory, a magnetic tape, a removable computer diskette, a random access memory (RAM), a read-only memory (ROM), a rigid magnetic disk, and/or an optical disk. In one or more embodiments using optical disks, memory 704 includes a compact disk-read only memory (CD-ROM), a compact disk-read/write (CD-R/W), and/or a digital video disc (DVD).

In one or more embodiments, the memory 704 may store computer program code (instructions) 706 configured to cause system 70 (where such execution represents, at least in part, the EDA tool) to be usable for performing a portion or all of the noted processes and/or methods. In one or more embodiments, the memory 704 may store information which facilitates performing a portion or all of the noted processes and/or methods. In one or more embodiments, the memory 704 may store library 707 of standard cells including such standard cells as disclosed herein and one or more layout diagrams 705 such as are disclosed herein.

The system 70 may include I/O interface 710. I/O interface 710 may be coupled to external circuitry. In one or more embodiments, I/O interface 710 may include a keyboard, keypad, mouse, trackball, trackpad, touchscreen, and/or cursor direction keys for communicating information and commands to the processor 702.

The system 70 may include network interface 712 coupled to processor 702. Network interface 712 may allow system 70 to communicate with network 714, to which one or more other computer systems are connected. Network interface 712 may include wireless network interfaces such as BLUETOOTH, WIFI, WIMAX, GPRS, or WCDMA. Network interface 712 may include wired network interfaces such as ETHERNET, USB, or IEEE-1364. In one or more embodiments, a portion or all of noted processes and/or methods, is implemented in two or more systems 70.

The system 70 may be configured to receive information through I/O interface 710. The information received through I/O interface 710 may include one or more of instructions, data, design rules, libraries of standard cells, and/or other parameters for processing by processor 702. The information may be transferred to processor 702 via the bus 708. System 70 may be configured to receive information related to a UI through I/O interface 710. The information may be stored in memory 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods are implemented as a software application running on the system 70. In some embodiments, a layout diagram which includes standard cells is generated using a tool such as VIRTUOSO® available from CADENCE DESIGN SYSTEMS, Inc., or another suitable layout generating tool.

In some embodiments, the processor 702 is realized as functions of a program stored in a non-transitory computer readable recording medium. Examples of a non-transitory computer readable recording medium may include, but not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
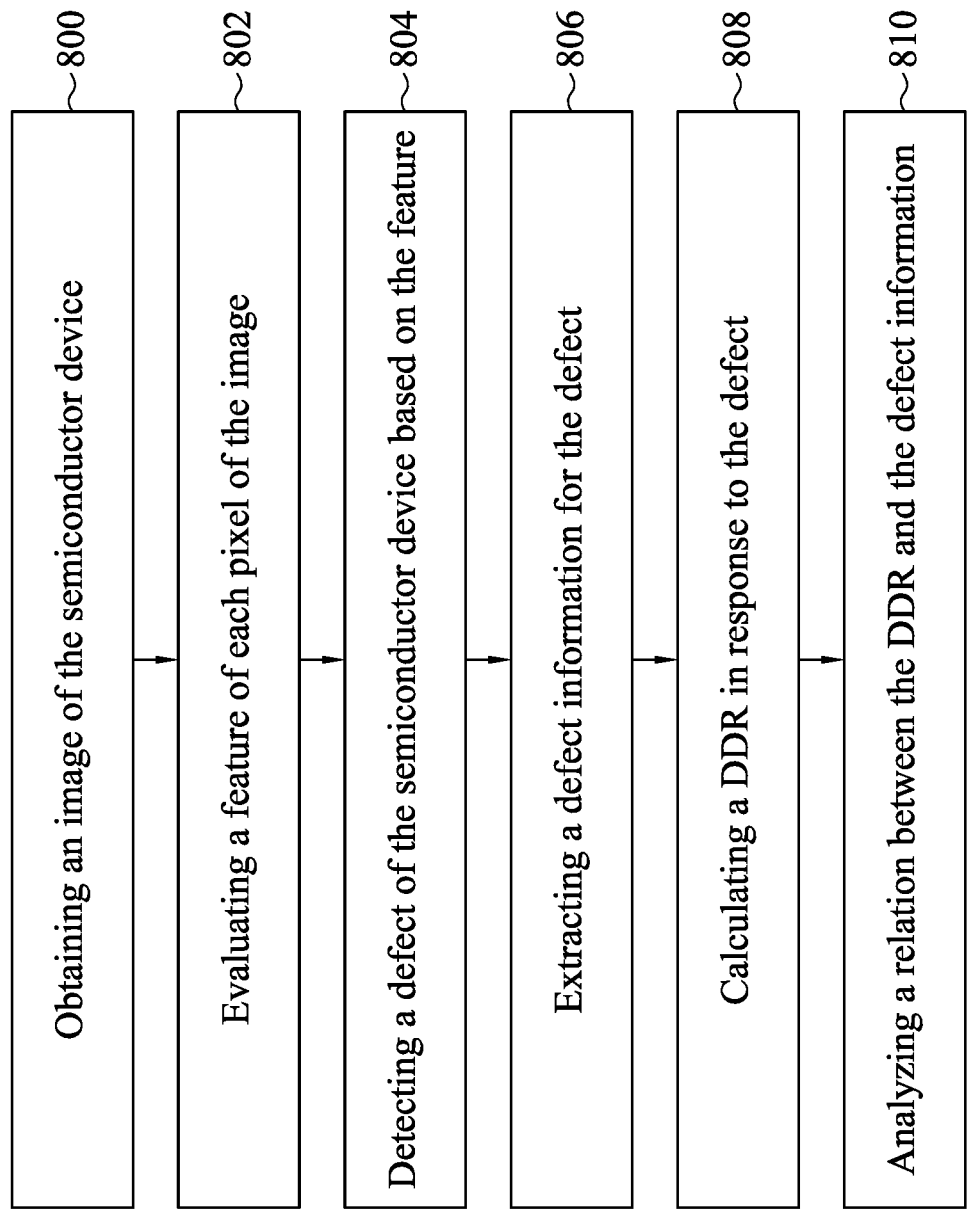
FIG. 8 is a flowchart showing operations for detecting a defect in a semiconductor device, in accordance with some embodiments of the present disclosure.

FIG. 8 is a flowchart showing operations for detecting a defect in a semiconductor device, in accordance with some embodiments of the present disclosure. In operation 800, an image of the semiconductor device can be obtained. In operation 802, a feature of each pixel of the image is calculated or evaluated, such as the brightness. In operation 804, a defect of the semiconductor device can be detected or inspected based on the feature of the pixel.

Furthermore, in operation 806, a defect information for the defect can be extracted, such as a defect position, a defect perimeter, a defect area, a defect size and a total number of defects. In operation 808, a DDR in response to the defect can be calculated or simulated. In operation 810, a relationship between the DDR and the defect information can be analyzed or evaluated.

It should be noted that some operations may occur in different order and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
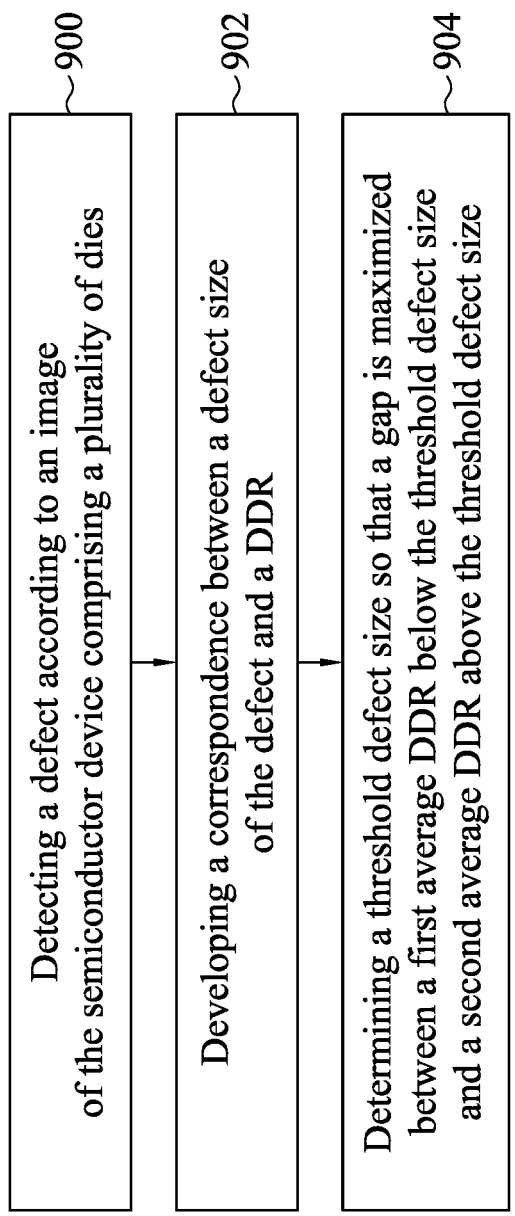
FIG. 9 is a flowchart showing other operations for detecting a defect in a semiconductor device, in accordance with some embodiments of the present disclosure.

FIG. 9 is a flowchart showing other operations for detecting a defect in a semiconductor device, in accordance with some embodiments of the present disclosure. In operation 900, a defect is detected or identified according to an image of the semiconductor device comprising a plurality of semiconductor dies. In operation 902, a correspondence between a defect size of the defect and a DDR can be developed or created. In operation 904, a threshold defect size can be determined so that a gap is maximized between a first average DDR below the threshold defect size and a second average DDR above the threshold defect size. In addition, the identified defect can be scrapped when the defect size exceeds the threshold defect size.

Some embodiments of the present disclosure provide a method for detecting a semiconductor device are provided. The method comprises utilizing an optical sensor to obtain an image of the semiconductor device; evaluating a feature of the image by a processor electrically coupling to the optical sensor; detecting a defect of the semiconductor device based on the feature by the processor; extracting a defect information for the defect by the processor; calculating a defect die ratio (DDR) in response to the defect by the processor; utilizing the processor to analyze a relation between the DDR and the defect information for filtering the semiconductor device; and discarding the semiconductor device when the defect information dissatisfies a threshold.

Some embodiments of the present disclosure provide a method for detecting a semiconductor device are provided. The method comprises capturing an image of the semiconductor device by an optical sensor, wherein the semiconductor device comprises a plurality of dies; detecting a defect according to an the image of the semiconductor device comprising a plurality of dies by a processor electrically coupling to the optical sensor; utilizing the processor to developing a correspondence between a defect size of the defect and a defect die ratio (DDR) by the processor; and determining a threshold defect size by the processor so that a gap is maximized between a first average DDR below the threshold defect size and a second average DDR above the threshold defect size.

Some embodiments of the present disclosure provide a system for detecting a semiconductor device. The system includes at least one processing unit and at least one memory including computer program code for one or more programs. The at least one memory, the computer program code and the at least one processing unit are configured to cause the system to perform: evaluate a feature of the image of the semiconductor device obtained from an optical sensor; detecting a defect of the semiconductor device based on the feature; extract a defect information for the defect; calculate a DDR in response to the defect; and analyze a relation between the DDR and the defect information; and scraping the semiconductor device when the defect information fails to meet a threshold.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting a semiconductor device, comprising:

utilizing an optical sensor to obtain an image of the semiconductor device;
evaluating a feature of the image by a processor electrically coupling to the optical sensor;
detecting a defect of the semiconductor device based on the feature by the processor;
extracting a defect information for the defect by the processor;
calculating a defect die ratio (DDR) in response to the defect by the processor;
utilizing the processor to analyze a relation between the DDR and the defect information for filtering the semiconductor device; and
discarding the semiconductor device when the defect information dissatisfies a threshold.

2. The method of claim 1, wherein the defect information comprises at least one of a defect position, a defect perimeter, a defect area, a defect size and a total number of the defect.

3. The method of claim 2, wherein the DDR is substantially proportional to the defect size.

4. The method of claim 3, further comprising:
determining the threshold as a threshold defect size by the processor to maximize a difference between a first average DDR below the threshold defect size and a second average DDR above the threshold defect size.

5. The method of claim 1, wherein the feature comprises a brightness.

6. The method of claim 5, wherein the defect is detected when the brightness is greater than a threshold brightness value.

7. The method of claim 2, further comprising:
utilizing the processor to obtain a ratio by dividing the defect area with the defect perimeter; and
determining a defect type according to the ratio by the processor.

8. The method of claim 7, further comprising:
determining the defect type as a trap void by the processor when the ratio is approximately equal to one.

9. The method of claim 8, further comprising:
analyzing the relation between the DDR and the defect information by the processor when the defect type is the trap void.

10. A method for detecting a semiconductor device, comprising:
capturing an image of the semiconductor device by an optical sensor, wherein the semiconductor device comprises a plurality of dies;
detecting a defect according to the image by a processor electrically coupling to the optical sensor;
utilizing the processor to develop a correspondence between a defect size of the defect and a defect die ratio (DDR) by the processor; and
determining a threshold defect size by the processor so that a gap is maximized between a first average DDR below the threshold defect size and a second average DDR above the threshold defect size.

11. The method of claim 10, further comprising:
scraping the semiconductor device when the defect size is greater than the threshold defect size.

12. The method of claim 10, further comprising:
utilizing the processor to calculate a defect area and a defect perimeter based on the image.

13. The method of claim 12, further comprising:
determining that the defect is a trap void by the processor when the defect area is approximately equal to the defect perimeter.

14. The method of claim 13, wherein the trap void is generated during the process of bonding a first wafer of the semiconductor device to a second wafer of the semiconductor device.

15. The method of claim 10, wherein the DDR is linearly proportional to the defect size in the correspondence.

16. A system for detecting a semiconductor device, comprising:
at least one processing unit; and
at least one memory including computer program code for one or more programs;
wherein the at least one memory, the computer program code and the at least one processing unit are configured to cause the system to perform:
evaluate a feature of the image of the semiconductor device obtained from an optical sensor;
detect a defect of the semiconductor device based on the feature;
extract a defect information for the defect;
calculate a defect die ratio (DDR) in response to the defect;
analyze a relationship between the DDR and the defect information; and
scraping the semiconductor device when the defect information fails to meet a threshold.

17. The system of claim 16, wherein the feature comprises a brightness, and the defect is detected when the brightness is greater than a threshold brightness value.

18. The system of claim 16, wherein the defect information comprises at least one of a defect position, a defect perimeter, a defect area, a defect size and a total number of the defect.

19. The system of claim 18, wherein the at least one memory, the computer program code and the at least one processing unit are further configured to cause the system to:
determine the threshold as a threshold defect size to maximize a difference between a first average DDR below the threshold defect size and a second average DDR above the threshold defect size.

20. The system of claim 18, wherein the at least one memory, the computer program code and the at least one processing unit are further configured to cause the system to:
determine that the defect is a trap void when the defect area is approximately equal to the defect perimeter.

* * * * *